United States Patent
Chang et al.

(10) Patent No.: US 8,614,000 B2
(45) Date of Patent: Dec. 24, 2013

(54) COATED ARTICLE AND METHOD OF MAKING THE SAME

(75) Inventors: Hsin-Pei Chang, New Taipei (TW); Wen-Rong Chen, New Taipei (TW); Huann-Wu Chiang, New Taipei (TW); Cheng-Shi Chen, New Taipei (TW); Ying-Ying Wang, Shenzhen (CN)

(73) Assignees: Hong Fu Jin Precision Industry (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 172 days.

(21) Appl. No.: 13/172,227

(22) Filed: Jun. 29, 2011

(65) Prior Publication Data

US 2012/0164435 A1    Jun. 28, 2012

(30) Foreign Application Priority Data

Dec. 25, 2010    (CN) .......................... 2010 1 0605425

(51) Int. Cl.
*B32B 9/00*    (2006.01)

(52) U.S. Cl.
USPC ............................................ 428/336; 428/698

(58) Field of Classification Search
USPC .................................................. 428/336, 698
See application file for complete search history.

(56) References Cited

U.S. PATENT DOCUMENTS

| 4,284,687 | A | * | 8/1981 | Dreyer et al. ................. 428/336 |
| 5,223,350 | A | * | 6/1993 | Kobayashi et al. ........... 428/697 |
| 8,129,040 | B2 | * | 3/2012 | Quinto et al. ................. 428/698 |

FOREIGN PATENT DOCUMENTS

| DE | 19741800 | * | 3/1998 |
| JP | 2002-20616 | * | 7/2002 |
| JP | 2007-277019 | * | 10/2007 |
| WO | 01/36341 | * | 5/2001 |

* cited by examiner

*Primary Examiner* — Archene Turner
*(74) Attorney, Agent, or Firm* — Altis Law Group, Inc.

(57) ABSTRACT

A coated article includes a bonding layer, a chromium oxynitride layer a boron nitride layer formed on a substrate in that order. The boron nitride layer is made of hexagonal structure boron nitride.

6 Claims, 2 Drawing Sheets

COATED ARTICLE AND METHOD OF MAKING THE SAME

BACKGROUND

Technical Field

This disclosure relates to a coated article and a method of making the same.

Die steel is widely applied to production process, e.g., forging, punching, die casting. However, a surface of the die steel can oxidize easily at a high temperatures, and the oxidation may affect the appearance of the products. In order to improve the properties of the die steel, a film made of metal nitride and metal carbide is formed on the die steel by physical vapor deposition (PVD). This film makes the die steel have a high hardness and a chemical stability. However, the film made of metal nitride and metal carbide does not have a good adhesion to metal bases and may be easily peeled off.

Therefore, there is room for improvement within the art.

BRIEF DESCRIPTION OF THE DRAWINGS

Many aspects of the coated article and method of making the same can be better understood with reference to the following drawings. The components in the drawings are not necessarily drawn to scale, the emphasis instead being placed upon clearly illustrating the principles of the coated article and method of making the same.

DETAILED DESCRIPTION

Figure 1:
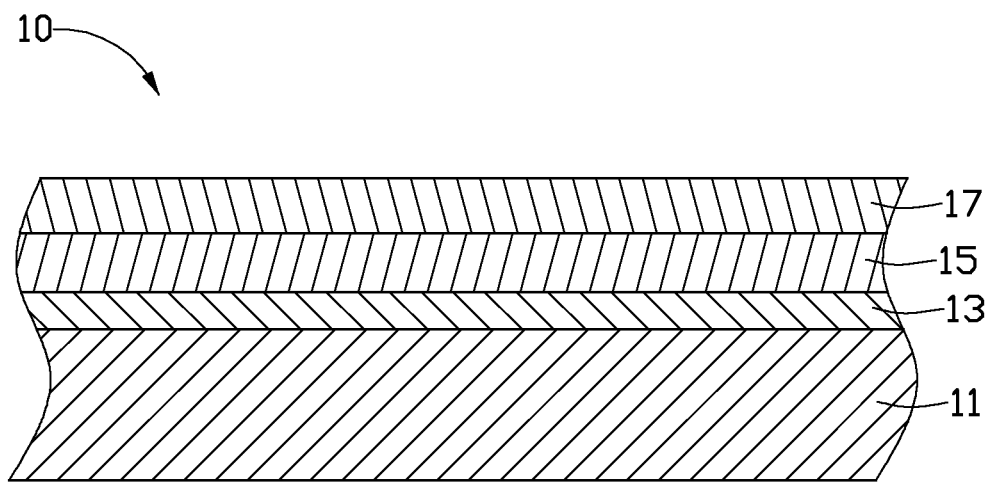
FIG. 1 is a schematic view of a coated article, in accordance with an exemplary embodiment.

FIG. 1 shows an exemplary embodiment of a coated article 10. The coated article 10 includes substrate 11 having a bonding layer 13, a chromium oxynitride (CrON) layer 15, and a boron nitride (BN) layer 17 formed thereon. The substrate 11 is made of die steel. In this embodiment, the substrate 11 is used to mold glass products. The bonding layer 13 and the chromium oxynitride layer 15 are formed by magnetron sputtering. The bonding layer 13 is made of chromium (Cr) and has a thickness about 50 nm to 150 nm. The chromium oxynitride layer 15 is compact and has a thickness from about 200 nm to about 700 nm. The boron nitride layer 17 is formed by vacuum evaporation, and has a thickness from about 200 nm to about 600 nm. The boron nitride layer 17 is made of hexagonal structure boron nitride, which has a structure and properties similar to graphite, having good lubrication properties.

A method of making the coated article 10 includes the following steps:

A substrate 11 is provided. The substrate 11 is made of die steel. In this embodiment, the substrate 11 is used to mold glass products.

The substrate 11 is immersed into an absolute ethanol solution and is cleaned by ultrasound for about 5 min to about 10 min. Thus, stains on the surface of the substrate 11 are removed.

Figure 2:
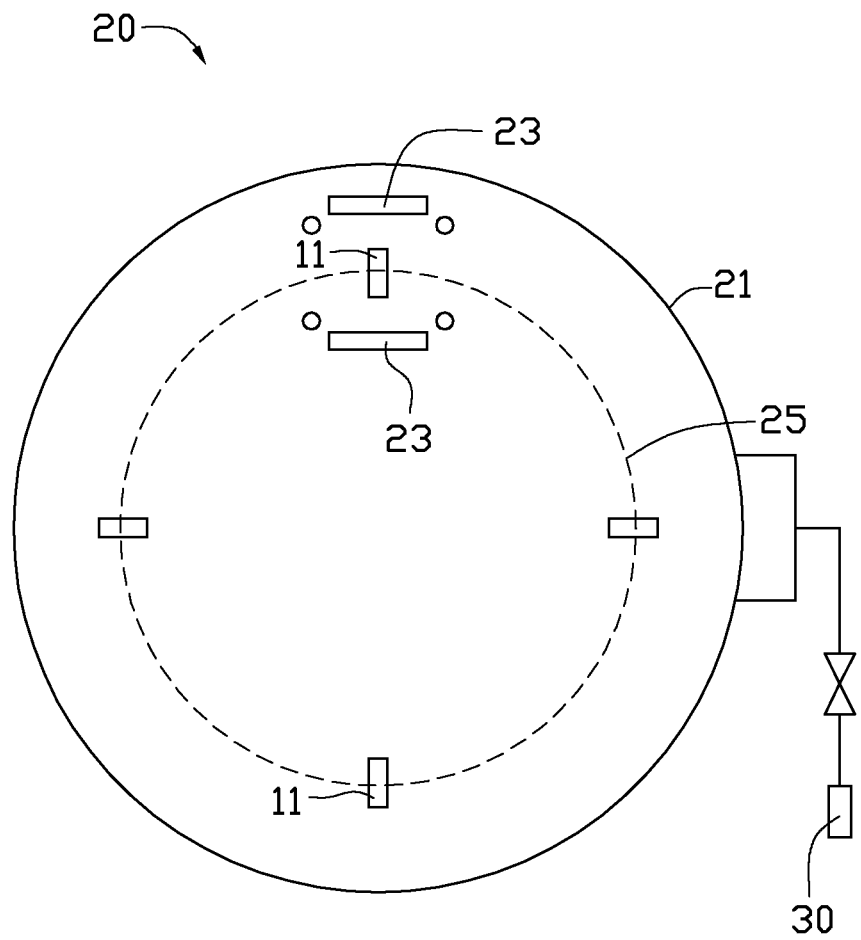
FIG. 2 is a schematic view of a vacuum sputtering coating machine applied to form the coated article shown in FIG. 1.

The substrate 11 is cleaned by argon gas plasma. This process can further remove oil on the substrate 11, which can increase a bonding force between the substrate 11 and the following layer formed on the substrate 11. Referring to FIG. 2, in this process, a vacuum sputtering coating machine 20 is applied. The coating machine 20 includes a vacuum chamber 21 and a vacuum air pump 30 for pumping out air in the vacuum chamber 21. A rotating stand (not shown) and two chromium targets 23 are disposed in the vacuum chamber 21. The rotating stand brings the substrate 11 to rotate along a circular trace 25 while the substrate 11 rotates relative to an axis thereof.

During cleaning, air in the chamber is pumped out until the pressure in the chamber is about $3.0 \times 10^{-5}$ Pascals (Pa). Argon gas is then fed into the chamber at a flow rate of about 500 standard cubic centimeter per minute (sccm). The purity of the argon gas is 99.9999%. A pressure in the chamber is about $6.7 \times 10^{-3}$ Pa. A bias voltage in a range of about −200V to about −500V is applied to the substrate 11, and the substrate 11 is then cleaned with argon gas plasma. The cleaning time is from about 3 minutes (min) to about 10 min.

A bonding layer 13 made of chromium is formed on the substrate 11 by magnetron sputtering. The chromium targets 23 are activated. Argon gas is provided as a working gas having a flow rate in a range of about 100 sccm to about 300 sccm. A bias voltage in a range of about −100V to about −300V is applied to the substrate 11. The substrate 11 is heated to a temperature of about 100° C. to about 300° C. The sputtering time is in a range from about 5 min to about 10 min. A thickness of the bonding layer 13 is about 100 nm to about 300 nm.

A chromium oxynitride layer 15 is formed on the bonding layer 13 by magnetron sputtering. Oxygen gas and nitrogen gas as two reaction gases are injected into the vacuum chamber 21. A flow rate of the oxygen gas is in a range of about 20 sccm to about 60 sccm. A flow rate of the nitrogen gas is in a range of about 50 sccm to about 200 sccm. The other technological parameters are similar to those of the step of forming the bonding layer. The sputtering time is in a range of about 20 min to about 60 min. The chromium oxynitride layer 15 has a thickness of about 200 nm to about 700 nm.

A boron nitride layer 17 is formed on the chromium oxynitride layer 15 by vacuum evaporation, a vacuum evaporation machine is applied. A hexagonal structure boron nitride powder is disposed in the vacuum evaporation. A pre-melting treatment is applied to the powder of hexagonal boron nitride for about 20 second (s) to about 30 s. During the pre-melting treatment, the vacuum evaporation gives an electronic beam current to heat the hexagonal structure boron nitride powder, a maximum of the electronic beam current reach from about 100 mA to about 180 mA. A speed rate of the vacuum evaporation is in a range of about 20 nm/s to about 30 nm/s. A pressure in the vacuum evaporation before vacuum evaporation is about $6.7 \times 10^{-3}$ Pa. Argon gas is provided as a working gas having a flow rate in a range of about 5 sccm to about 30 sccm. A temperature of the substrate 11 is from about 100° C. to about 200° C. The time of the evaporation is in a range of about 30 min to about 60 min. A thickness of the boron nitride layer 17 is in a range of about 200 nm to about 600 nm.

The present disclosure is described further in detail using examples as follows, but is not limited by the following examples.

Example I

The vacuum sputtering coating machine 20 is a mid-frequency magnetron sputtering machine, made by Shenzhen Nanfang Chuangxin Vacuum Technology Co., Ltd., type: SM-1100H. The vacuum evaporation machine is made by Hanil Co., Ltd, type: HVC-900DA.

During the time that the substrate 11 is being cleaned by argon gas plasma, the flow rate of the argon gas is about 500 sccm. A bias voltage of about −200V is applied to the substrate 11. The substrate 11 is cleaned with the argon gas plasma for about 10 min.

During the forming of the bonding layer 13, the flow rate of the argon gas is about 300 sccm. A bias voltage of about −200V is applied to the substrate 11. The cleaning time is about 10 min. The sputtering time is about 10 min. A thickness of the bonding layer 13 is about 300 nm.

During the forming of the chromium oxynitride layer 15, the flow rate of the oxygen gas is about 40 sccm. The flow rate of the nitrogen gas is about 80 sccm. The other technological parameters are similar to the process of forming the bonding layer 13. The sputtering time is 30 min. A thickness of the chromium oxynitride layer 15 is about 400 nm.

During the forming of the boron nitride layer 17, a flow rate of the argon gas is about 15 sccm. The time of the pre-melting treatment is about 20 s, and the maximum of the electronic beam current is about 120 mA. A speed rate of the vacuum evaporation is about 20 nm/s. The temperature of the substrate 11 is about 120° C. The time of the evaporation is 30 min. The thickness of the boron nitride layer 17 is about 400 nm.

Example II

In this embodiment, the vacuum sputtering coating machine 20 and the vacuum evaporation machine are similar to the first embodiment.

During the time that the substrate 11 is being cleaned by argon gas plasma, the flow rate of the argon gas is about 500 sccm. A bias voltage of about −200V is applied to the substrate 11. The cleaning time is about 10 min.

During the forming of the bonding layer 13, the flow rate of the argon gas is about 300 sccm. A bias voltage of about −200V is applied to the substrate 11. The substrate 11 is heated to a temperature of about 120° C. The sputtering time is about 10 min. A thickness of the bonding layer 13 is about 300 nm.

During the forming of the chromium oxynitride layer 15, the flow rate of the oxygen gas is about 40 sccm. The flow rate of the nitrogen gas is about 100 sccm. The other technological parameters are similar to the process of forming the bonding layer 13. The sputtering time is about 30 min. A thickness of the chromium oxynitride layer 15 is about 400 nm.

During the forming of the boron nitride layer 17, a flow rate of the argon gas is about 15 sccm. The time of pre-melting treatment is about 20 s, and the maximum of the electronic beam current is about 120 mA. A speed rate of the vacuum evaporation is about 30 nm/s. The temperature of the substrate 11 is about 120° C. The time of the evaporation is about 40 min. The thickness of the boron nitride layer 17 is about 600 nm.

A test of high-temperature oxidation resistance is applied to the coated articles 10 achieved by the above methods. The details and the result of the test method are described as follows.

The test instrument is a tubular furnace for thermal treatment. During the test, a speed rate of heating the coated articles 10 is about 10° C./min. A temperature of air in the tubular furnace is about 800° C., and the temperature is maintained for about 10 hours (h).

The test result shows that the coated articles 10 do not appear to oxidize or peel after the thermal treatment.

The bonding layer 13, the chromium oxynitride layer 15 and the boron nitride layer 17 are formed on the substrate 11 in that order. The layer system of the coated article 10 has a good transition, and no obvious stress is formed inside the layers. The chromium oxynitride layer 15 and the boron nitride layer 17 are compact, which can prevent oxygen in the atmosphere from diffusing in the layers. Since the chromium oxynitride layer 15 and the boron nitride layer 17 do not oxidize at a temperature of about 800° C. for 10 h, the coated articles 10 can be used for a long time at high temperatures. In addition, the boron nitride layer 17 is a lubricant, which can help the glass products to be smoothly removed from the mold.

It is to be understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A coated article, comprising:
   a substrate;
   a bonding layer formed on the substrate;
   a chromium oxynitride layer directly formed on the bonding layer; and
   a boron nitride layer directly formed on the chromium oxynitride layer, the boron nitride layer made of hexagonal structure boron nitride.

2. The coated article as claimed in claim 1, wherein the substrate is made of die steel.

3. The coated article as claimed in claim 1, wherein the bonding layer is made of chromium.

4. The coated article as claimed in claim 1, wherein the bonding layer is formed by magnetron sputtering and has a thickness in a range of about 50 nm to about 150 nm.

5. The coated article as claimed in claim 1, wherein the chromium oxynitride layer is formed by magnetron sputtering and has a thickness in a range of about 200 nm to about 700 nm.

6. The coated article as claimed in claim 1, wherein the boron nitride layer is formed by vacuum evaporation, and has a thickness in a range of about 200 nm to about 600 nm.

\* \* \* \* \*